United States Patent
Schinerl et al.

(10) Patent No.: US 11,095,114 B2
(45) Date of Patent: Aug. 17, 2021

(54) METHOD FOR IDENTIFYING AN OUTGOING CIRCUIT HAVING AN EARTH FAULT IN A THREE-PHASE POWER SUPPLY SYSTEM

(71) Applicant: Siemens Aktiengesellschaft, Munich (DE)

(72) Inventors: Thomas Schinerl, Hörsching (AT); Markus Aigner, Stadl-Paura (AT); Harald Osterkorn, Steyregg (AT)

(73) Assignee: SIEMENS ENERGY GLOBAL GMBH & CO. KG, Munich (DE)

( * ) Notice: Subject to any disclaimer, the term of this patent is extended or adjusted under 35 U.S.C. 154(b) by 26 days.

(21) Appl. No.: 16/607,833

(22) PCT Filed: Apr. 3, 2018

(86) PCT No.: PCT/EP2018/058397
§ 371 (c)(1),
(2) Date: Oct. 24, 2019

(87) PCT Pub. No.: WO2018/197162
PCT Pub. Date: Nov. 1, 2018

(65) Prior Publication Data
US 2020/0191844 A1    Jun. 18, 2020

(30) Foreign Application Priority Data

Apr. 25, 2017   (AT) .............................. A 50333/2017

(51) Int. Cl.
*H02H 3/33*    (2006.01)
*G01R 27/18*    (2006.01)
(Continued)

(52) U.S. Cl.
CPC ............... *H02H 3/33* (2013.01); *G01R 27/18* (2013.01); *G01R 31/086* (2013.01); *G01R 31/52* (2020.01)

(58) Field of Classification Search
CPC ...... G01R 27/18; G01R 31/52; G01R 31/086; H02H 3/33; H02H 3/16; H02H 3/38; H02H 3/165; H02H 7/26
(Continued)

(56) References Cited

U.S. PATENT DOCUMENTS

2011/0210750 A1* 9/2011 Medelius ................. H01B 1/24
                                                        324/543
2016/0146890 A1* 5/2016 Fujie ........................ H02H 3/16
                                                        324/765.01

FOREIGN PATENT DOCUMENTS

DE          10302451         7/2004
DE         102009020908      4/2010
(Continued)

OTHER PUBLICATIONS

PCT International Search Report based on PCT/EP2018/058397 filed Apr. 3, 2018 dated Aug. 23, 2018.

*Primary Examiner* — Farhana A Hoque
(74) *Attorney, Agent, or Firm* — Cozen O'Connor

(57) ABSTRACT

A method for identifying an outgoing circuit having an earth fault in a three-phase power supply system, wherein a zero voltage and zero currents of outgoing circuits are measured and stored, where a space vector representation of the zero voltage and an active component of the space vector representation of zero currents are determined and, after determining an earth fault at a first time, a second time at which the space vector representation of the zero voltage has a local minimum and a third time at which the space vector representation of the zero voltage has a local maximum are determined, where the trapezoidal sum of the active com-
(Continued)

ponent of the space vector representation of the zero currents is determined and used to determine the outgoing circuit having the earth fault via comparison with a predefined variable threshold value, an earth fault being determined if this threshold value is exceeded.

9 Claims, 2 Drawing Sheets

(51) Int. Cl.
    *G01R 31/08*     (2020.01)
    *G01R 31/52*     (2020.01)

(58) Field of Classification Search
    USPC .......................................................... 324/509
    See application file for complete search history.

(56) References Cited

FOREIGN PATENT DOCUMENTS

| | | |
|---|---|---|
| EP | 0999633 | 5/2000 |
| EP | 1526621 | 4/2005 |
| EP | 3046197 | 7/2016 |

\* cited by examiner

METHOD FOR IDENTIFYING AN OUTGOING CIRCUIT HAVING AN EARTH FAULT IN A THREE-PHASE POWER SUPPLY SYSTEM

CROSS-REFERENCE TO RELATED APPLICATIONS

This is a U.S. national stage of application No. PCT/EP2018/058397 filed Apr. 3, 2018. Priority is claimed on AT Application No. A50333/2017 filed Apr. 25, 2017, the content of which is incorporated herein by reference in its entirety.

BACKGROUND OF THE INVENTION

1. Field of the Invention

The invention relates to a method for identifying an outgoing circuit having a reigniting or intermittent earth fault in a three-phase power supply system.

2. Description of the Related Art

Earth faults represent the most common faults in medium-voltage systems. Such earth faults are triggered, for example, by cable damage, by a tree growing into an overhead line, by wind damage or by faulty insulation of the installation. The physical principles of the earth fault and methods for locating and clearing these faults using Petersen coils are described in "*Druml, Gernot. Innovative Methoden zur Erdschlussortung and Petersen-Spulen Regelung [Innovative methods for earth fault location and Petersen coil control]. na, 2012*".

In this context, reigniting or intermittent earth faults are a particular challenge. These occur primarily in three-phase power supply systems in which the neutral point of the transformer is earthed via a Petersen coil.

EP 1 526 621 B1 discloses a method for identifying an outgoing circuit having an intermittent earth fault in a busbar of a three-phase supply system, in which each occurrence of a transient earth fault on an outgoing circuit is detected and a criterion is obtained from the occurrence which displays an outgoing circuit as having an intermittent earth fault.

According to the teachings of this publication, a measurement value is periodically obtained for each outgoing circuit, which for each period (i) upon the occurrence of a transient earth fault on this outgoing circuit, is increased by a first value maximally to an upper limit value, (ii) upon the occurrence of a transient earth fault on another outgoing circuit, is reduced by the first value minimally to a lower limit value, and (iii) in the absence of a transient earth fault, is varied by a second, smaller value in the direction of zero, where an outgoing circuit is displayed as affected if the measurement value of said outgoing circuit exceeds a threshold value that is greater than the first value and smaller than or equal to the upper limit value.

DE 10 302 451 B3 describes a method for identifying the direction from the charging oscillation of one-time igniting, reigniting and intermittent earth faults, in which an earth fault is established if the amount of the zero voltage exceeds a predefined limit value at which furthermore charging conditions of the outgoing circuits are determined and the outgoing circuits affected by an earth fault are determined from the characteristic curve of the charging conditions.

SUMMARY OF THE INVENTION

It is an object of the invention to provide a method for identifying an outgoing circuit having an earth fault in a three-phase power supply system.

This and other objects and advantages are achieved in accordance with the invention by a method for identifying an outgoing circuit having an earth fault in a three-phase power supply system, where the zero voltage occurring at a neutral point and the zero currents of the outgoing circuits are measured and stored at periodically recurring times, where a space vector representation of the zero voltage and an active component of the space vector representation of the zero currents are determined based on the space vector representation of the zero voltage via transformation, where after an earth fault has been determined at a first time, a second time at which the space vector representation of the zero voltage has a local minimum is determined and subsequently a third time at which the space vector representation of the zero voltage has a local maximum is determined, and where the trapezoidal sum of the active component of the space vector representation of the zero currents is determined between a second time and a third time and is used to determine the outgoing circuit having the earth fault such that the trapezoidal sum of the active component of the space vector representation of the zero currents is compared to a predefined variable threshold value and an earth fault is determined if this threshold value is exceeded.

BRIEF DESCRIPTION OF THE DRAWINGS

The invention is explained in greater detail with reference to the figures, in which.

DETAILED DESCRIPTION OF THE EXEMPLARY EMBODIMENTS

Figure 1:
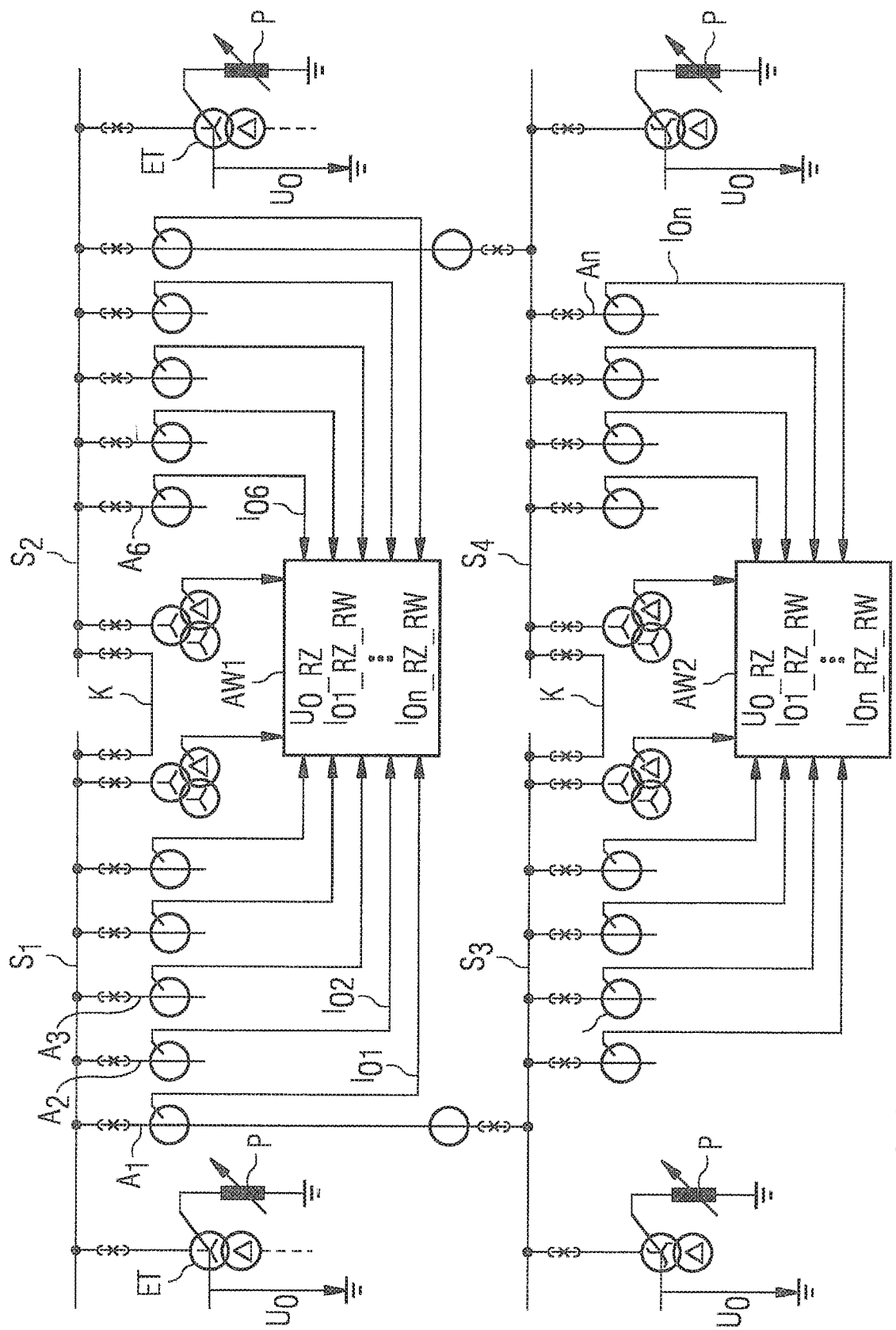
FIG. 1 shows a schematic illustration of an exemplary medium-voltage three-phase power supply system in which the method in accordance with the invention is implemented.

A medium-voltage three-phase power supply system, as illustrated by way of example in the FIG. 1, is typically used to supply electrical energy to a region which comprises a plurality of localities, or in cities an urban district.

The nodes of the system are formed by busbars S, to which the outgoing circuits $A_1, A_2, \ldots A_n$, i.e., the branches to consumers, as well as infeeds and couplings to other system nodes, are connected via switchgear.

In the illustrated example, the infeed occurs via infeed transformers ET from superordinate high-voltage systems.

The secondary-side neutral points of the infeed transformers ET are connected to the earth potential via a "Petersen coil" P or earth fault suppression coil, such that in the event of unintended earth faults in a line conductor the capacitive earth fault currents are compensated and at the location of the fault the fault voltage is reduced, as is described by way of example in "*Druml, Gernot. Innovative Methoden zur Erdschlussortung and Petersen-Spulen Regelung [Innovative methods for earth fault location and Petersen coil control]. na, 2012*".

The earth fault compensation occurs in each partial system of the medium-voltage system divided via couplings K.

The automatic tuning of the adjustable Petersen coils can, for example, occur via earth fault compensation regulators of the type EFC50 and EFC50i from Trench Austria GmbH.

The aforementioned company also offers devices of the type EFD 500 for the detection of earth faults. To this end, the zero voltage $U_0$ of the medium-voltage system occurring on the Petersen coil P and the zero currents $I_{01}, I_{02}, \ldots I_{0n}$ of the outgoing circuits $A_1, A_2, \ldots A_n$ are detected and evaluated.

In accordance with the invention, via evaluation devices AW1, AW2 for identifying an outgoing circuit having an earth fault in a three-phase power supply system, the values, measured and stored at periodically recurring times, of the zero voltage $U_0$ occurring at a neutral point or a Petersen coil are now converted via transformation into a space vector representation of the zero voltage $U_{0\_RZ}$ and the zero currents $I_{01}, I_{02}, \ldots, I_{0n}$ of the outgoing circuits $A_1, A_2, \ldots, A_n$ into an active component of the space vector representation of the zero currents $I_{01\_RZ\_WK}, I_{02\_RZ\_WK}, \ldots, I_{0n\_RZ\_WK}$ based on the space vector representation of the zero voltage $U_{0\_RZ}$.

The space vector representation, as described in "*Druml, Gernot. Innovative Methoden zur Erdschlussortung and Petersen-Spulen Regelung [Innovative methods for earth fault location and Petersen coil control]. na, 2012*", results in a clear representation of transient operations.

Upon detection of an earth fault at a first time $t_1$ using known methods, as are also used, for example, by the devices of the type EFD 500 cited above, a second time $t_2$ is determined, at which the space vector representation of the zero voltage $U_{0\_RZ}$ has a local minimum. Subsequently, a third time $t_3$ is determined, at which the space vector representation of the zero voltage $U_{0\_RZ}$ has a local maximum.

In the period between the second time $t_2$ and the third time $t_3$, the trapezoidal sum of the active component of the space vector representation of the zero currents $I_{01\_RZ\_WK}, I_{02\_RZ\_WK}, \ldots, I_{0n\_RZ\_WK}$ is ascertained and used to determine the outgoing circuit having an earth fault.

The way in which this happens is that the trapezoidal sum of the active component of the space vector representation of the zero currents $I_{01\_RZ\_WK}, I_{02\_RZ\_WK}, \ldots, I_{0n\_RZ\_WK}$ is compared to a predefined variable threshold value and an earth fault is determined if this threshold value is exceeded.

The threshold value is adaptively adjusted to the total capacity of the outgoing circuits connected to a busbar and thus brings about the consideration of changing system variables. For example, the threshold value can be set as a particular percentage of the total system capacity.

The determination of the system capacity can occur using known methods, as are applied, for example, in the devices of the type EFC50 and EFD500 from Trench Austria GmbH.

This adaptive adjustment of the threshold value has the advantage that the method becomes more reliable.

A further increase in the reliability of the method is achieved because the method is aborted if the amount of the space vector representation of the zero voltage $U_{0\_RZ}$ exceeds a predefined range. Thus the physical limits of the measurement devices are taken into account, which otherwise could lead to erroneous results.

The exemplary embodiment shows a resonant-earthed system with Petersen coils P. However, the invention is also equally applicable to non-earthed systems. In these cases, the system capacity must, for example, be determined via cable data and switching states to determine the adaptive threshold value.

Figure 2:
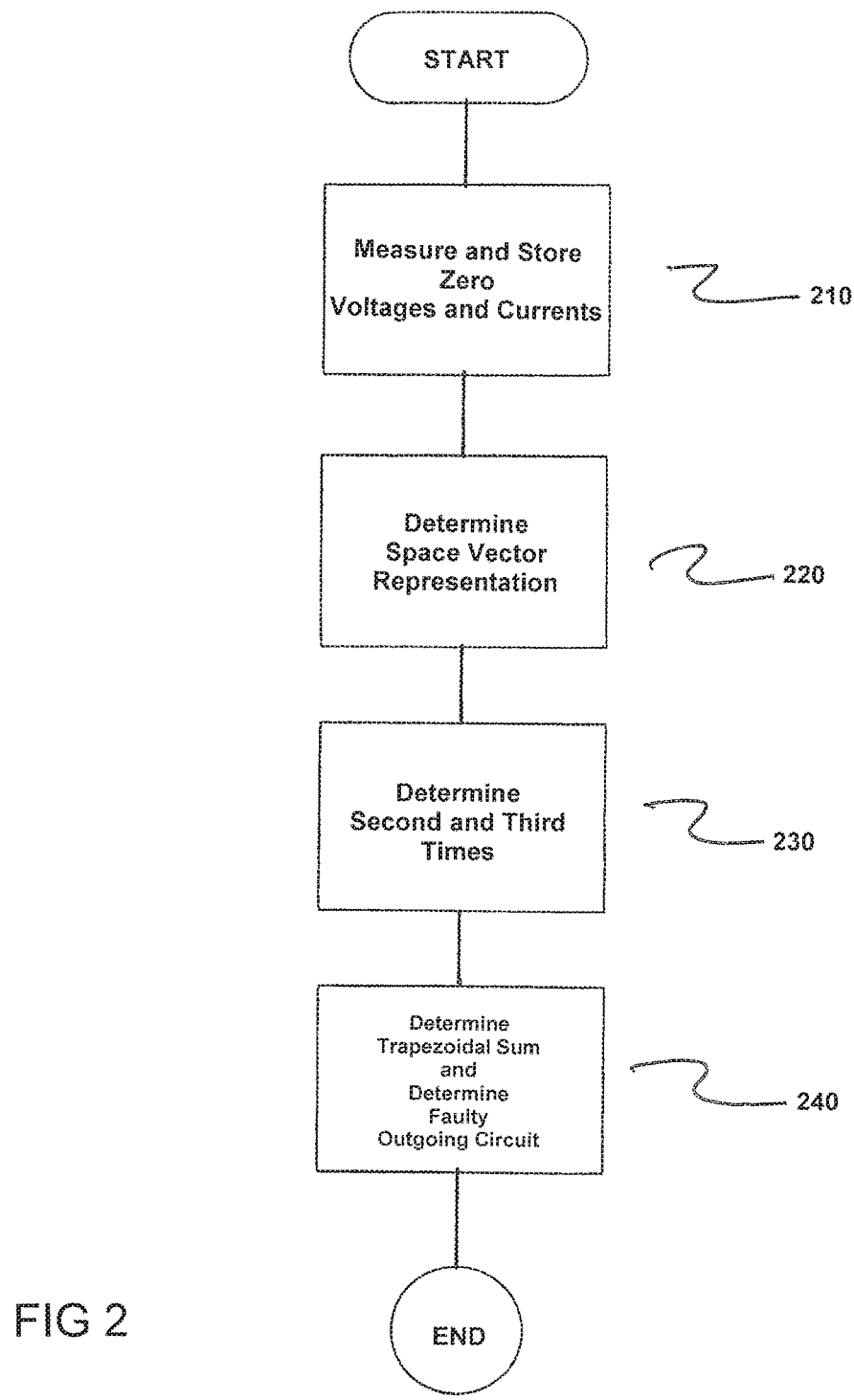
FIG. 2 is a flowchart of the method in accordance with the invention.

FIG. 2 is a flowchart of the method for identifying an outgoing circuit having an earth fault in a three-phase power supply system. The method comprises measuring and storing, at periodically recurring times, a zero voltage $U_0$ occurring at a neutral point and zero currents $I_{01}, I_{02}, \ldots I_{0n}$ of the outgoing circuits $A_1, A_2, \ldots A_n$, as indicated in step 210.

Next, a space vector representation of the zero voltage $U_{0\_RZ}$ and an active component of the space vector representation of the zero currents $I_{01\_RZ\_WK}, I_{02\_RZ\_WK}, \ldots, I_{0n\_RZ\_WK}$ are determined based on the space vector representation of the zero voltage $U_{0\_RZ}$ via a transformation, as indicated in step 220.

Next, after an earth fault has been determined at a first time $t_1$, a second time $t_2$ at which the space vector representation of the zero voltage $U_{0\_RZ}$ has a local minimum and subsequently a third time $t_3$ at which the space vector representation of the zero voltage $U_{0\_RZ}$ has a local maximum is determined, as indicated in step 230.

Next, a trapezoidal sum of an active component of the space vector representation of the zero currents $I_{01\_RZ\_WK}, I_{02\_RZ\_WK}, \ldots, I_{0n\_RZ\_WK}$ between a second time $t_2$ and a third time $t_3$ is determined and utilized to determine an outgoing circuit having the earth fault such that the trapezoidal sum of the active component of the space vector representation of the zero currents $I_{01\_RZ\_WK}, I_{02\_RZ\_WK}, \ldots, I_{0n\_RZ\_WK}$ is compared to a predefined variable threshold value and an earth fault is determined if said predefined variable threshold value is exceeded, as indicated in step 240.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for identifying an outgoing circuit having an earth fault in a three-phase power supply system, the method comprising:

measuring and storing, at periodically recurring times, a zero voltage occurring at a neutral point and zero currents of the outgoing circuits;

determining a space vector representation of the zero voltage and an active component of the space vector representation of the zero currents based on the space vector representation of the zero voltage via a transformation;

determining, after an earth fault has been determined at a first time, a second time at which the space vector representation of the zero voltage has a local minimum and subsequently a third time at which the space vector representation of the zero voltage has a local maximum;

determining a trapezoidal sum of an active component of the space vector representation of the zero currents between a second time and a third time and utilizing said determined trapezoidal sum to determine an outgoing circuit having the earth fault such that the trapezoidal sum of the active component of the space vector representation of the zero currents is compared to a predefined variable threshold value and an earth fault is determined if said predefined variable threshold value is exceeded; and performing an adaptive adjustment of the predefined variable threshold to a total capacity of the outgoing circuit connected to a busbar to set the predefined variable threshold value as a particular percentage of a total system capacity of the three-phase power supply system.

2. The method as claimed in claim 1, wherein an earth fault is determined if an amount of the space vector representation of the zero voltage exceeds a predefined limit value.

3. The method as claimed in claim 1, wherein the space vector representation of the zero voltage and the active component of the space vector representation of the zero currents is not stored until the first time.

4. The method as claimed in claim 2, wherein the space vector representation of the zero voltage and the active component of the space vector representation of the zero currents is not stored until the first time.

5. The method as claimed in claim 1, wherein a difference between a local minimum and a local maximum of space vector representations of the zero voltage must have a predefined minimum value.

6. The method as claimed in claim 1, wherein the method is aborted if an amount of the space vector representation of the zero voltage exceeds a predefined range.

7. The method as claimed in claim 1, wherein weighting function is utilized to evaluate the trapezoidal sum;
  wherein the weighting function is increased upon occurrence of an earth fault on a corresponding outgoing circuit by a first value up to an upper maximum limit value;
  wherein upon occurrence of a transient earth fault on another outgoing circuit the weighting function is reduced by the first value to a lower minimal limit value; and
  wherein in the absence of a transient earth fault the weighting function is modified by a second, smaller value in a direction toward zero, an outgoing circuit being displayed as affected if the trapezoidal sum of said outgoing circuit evaluated using the weighting function exceeds a threshold value.

8. The method as claimed in claim 1, wherein the predefined variable threshold value is determined from a total capacity of the outgoing circuits connected to the busbar.

9. The method as claimed in claim 8, wherein the variable threshold value is determined as a particular percentage of the total capacity of the outgoing circuits connected to the busbar.

* * * * *